US010727757B2

United States Patent
Jacobson et al.

(10) Patent No.: US 10,727,757 B2
(45) Date of Patent: Jul. 28, 2020

(54) HIGH VOLTAGE HIGH FREQUENCY POWER CONVERTER

(71) Applicant: Raytheon Company, Waltham, MA (US)

(72) Inventors: Boris S. Jacobson, Westford, MA (US); Evgeny N. Holmansky, Acton, MA (US); Lev Volfson, Framingham, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/295,461

(22) Filed: Mar. 7, 2019

(65) Prior Publication Data
US 2019/0207529 A1    Jul. 4, 2019

Related U.S. Application Data

(62) Division of application No. 15/231,944, filed on Aug. 9, 2016, now Pat. No. 10,270,356.

(51) Int. Cl.
*H02M 7/00*     (2006.01)
*H05K 5/02*     (2006.01)
(Continued)

(52) U.S. Cl.
CPC ............ *H02M 7/003* (2013.01); *H02M 3/22* (2013.01); *H02M 7/44* (2013.01); *H05K 5/0017* (2013.01);
(Continued)

(58) Field of Classification Search
CPC ........... H02M 2001/0009; H02M 3/22; H02M 7/003; H02M 7/44; H05K 5/0017;
(Continued)

(56) References Cited

U.S. PATENT DOCUMENTS 3,867,643 A    2/1975    Baker et al.
4,678,986 A    7/1987    Barthelemy
(Continued)

FOREIGN PATENT DOCUMENTS

CN    202906735 U    4/2013
EP    2666956 A1     11/2013
(Continued)

OTHER PUBLICATIONS

PCT International Search Report and Written Opinion of the International Searching Authority, or the Declaration for International Application No. PCT/US2017/045417, dated Oct. 9, 2017, 13 pages.
(Continued)

*Primary Examiner* — James Wu
(74) *Attorney, Agent, or Firm* — Cantor Colburn LLP

(57) ABSTRACT

A power converter includes an outer housing formed of dielectric material and including a low voltage compartment and a high voltage compartment is disclosed. The power converter also includes a low voltage DC-to-AC converter disposed in the low voltage compartment, a first coil in the low voltage compartment, a first conductive shield element lining an outer wall of the low voltage compartment, the first conductive shield element being electrically coupled to an electrical input of the DC-to-AC converter and a second conductive shield element lining an outer wall of the high voltage compartment.

14 Claims, 6 Drawing Sheets

(51) Int. Cl.
  *H02M 3/22* (2006.01)
  *H05K 7/14* (2006.01)
  *H05K 9/00* (2006.01)
  *H02M 7/44* (2006.01)
  *H05K 5/00* (2006.01)

(52) U.S. Cl.
  CPC ......... *H05K 5/0247* (2013.01); *H05K 7/1432* (2013.01); *H05K 9/0009* (2013.01); *H05K 9/0067* (2013.01)

(58) Field of Classification Search
  CPC .. H05K 5/0247; H05K 7/1432; H05K 9/0009; H05K 9/0067
  See application file for complete search history.

(56) References Cited

U.S. PATENT DOCUMENTS

| | | | |
|---|---|---|---|
| 4,814,963 | A | 3/1989 | Petersen |
| 5,434,770 | A | 7/1995 | Dreifuerst et al. |
| 5,530,302 | A | 6/1996 | Hamre et al. |
| 5,625,545 | A | 4/1997 | Hammond |
| 5,864,475 | A | 1/1999 | Ikawa et al. |
| 5,881,251 | A | 3/1999 | Fung et al. |
| 5,933,339 | A | 8/1999 | Duba et al. |
| 5,986,909 | A | 11/1999 | Hammond et al. |
| 6,153,947 | A | 11/2000 | Rockow et al. |
| 6,218,792 | B1 | 4/2001 | Berth et al. |
| 6,236,580 | B1 | 5/2001 | Aiello et al. |
| 6,400,203 | B1 | 6/2002 | Bezzi et al. |
| 6,704,825 | B1 | 3/2004 | Lascu et al. |
| 7,049,796 | B2 | 5/2006 | Cherniski et al. |
| 7,375,933 | B2 | 5/2008 | Tekletsadik |
| 7,986,535 | B2 | 7/2011 | Jacobson et al. |
| 8,227,939 | B2 | 7/2012 | Jacobson et al. |
| 2008/0174926 | A1 | 7/2008 | Evans et al. |
| 2014/0167733 | A1 | 6/2014 | Buck et al. |
| 2018/0048244 | A1 | 2/2018 | Jacobson et al. |

FOREIGN PATENT DOCUMENTS

| | | | |
|---|---|---|---|
| EP | 2958411 A1 | * | 12/2015 |
| EP | 2958411 A1 | | 12/2015 |
| WO | 2011009482 A1 | | 1/2011 |

OTHER PUBLICATIONS

R. Giri et al, "Common-Duty-Ratio Control of Input-Series Connected Modular DC-DC Converters with Active Input Voltage and Load-Current Sharing", IEEE Transactions on Industry Applications, vol. 42, No. 4, Jul./Aug. 2006. pp. 1101-1111.

V. Choudhary et al, "Fault Tolerant Circuit Topology and Control Method for Input-Series and Output-Parallel Modular DC-DC Converters", IEEE Trans Power Electron, vol. 23, No. 1, Jan. 2008. pp. 402-411.

* cited by examiner

HIGH VOLTAGE HIGH FREQUENCY POWER CONVERTER

CROSS REFERENCE TO RELATED APPLICATIONS

The present application is a divisional application of U.S. patent application Ser. No. 15/231,944 filed on Aug. 9, 2016, the contents of which are incorporated by reference herein in their entirety.

BACKGROUND

The present invention relates to providing power and, more specifically, to providing a compact, high-voltage power converter module.

Power converters are used to convert power from an input to a needed power for provision to a load. One type of power converter is a transformer. Power converters may be designed to convert a fixed AC or DC input voltage into a higher or lower AC or DC voltage. The architecture chosen may provide for high frequency operation, pulse-width-modulation, isolation, and the like.

An example of a power converter is a transformer. Different types of transformers may be used depending on a particular application. A typical power transformer includes one or more input windings and one or more output windings. The input and output windings are both wrapped around a core formed of a magnetic material. An alternating current provided at the input (e.g., primary) windings causes a varying magnetic flux in the transformer core. This flux leads to a time varying magnetic field that includes a voltage in the output (e.g., secondary) windings of the transformer.

In some cases, the core is so-called "closed-core." An example of closed-core is a "shell form" core. In a shell form, the primary and secondary windings are both wrapped around a central core arm and are both surrounded by outer arms. In some cases, more than one primary winding is provided and multiple secondary windings may also be provided. In such systems, based on the input and to which of the primary windings that input is provided (of course, power could also be provided to more than one primary winding in some instances) different output voltages can be created at each of the secondary windings.

Power converters for Power Branching Unit (PBU) for undersea applications need to reconcile conflicting requirements of high power density and exceedingly high reliability (e.g., 20 years of un-serviced operation). Consider FIG. 1. In particular, in FIG. 1, a low voltage region 102 is shown separated from a high voltage region 104 of a PBU 100 by an insulation barrier 106. Each region 104, 106 includes one or more components such as a winding or a power inverter that are generally shown by elements 108, 110, respectively. Coronal discharges (shown by arrows 112, 114) and eventual insulation breakdown may be caused by voltage concentration across the air gaps 116, 118 between component's edges and the insulation barrier 106. Insulation includes air (gap between the barrier and the edge of component) and solid material (inside the barrier). When voltage is applied across two dissimilar materials such as air and solid dielectric, the material with the lower permittivity (air) will receive higher stress. This problem is further complicated by the fact that voltage breakdown of air is sensitive to changes in humidity and altitude.

SUMMARY

According to one embodiment a power converter that includes an outer housing formed of dielectric material and including a low voltage compartment and a high voltage compartment is disclosed. The power converter also includes a low voltage DC-to-AC converter disposed in the low voltage compartment, a first coil in the low voltage compartment, a first conductive shield element lining an outer wall of the low voltage compartment, the first conductive shield element being electrically coupled to an electrical input of the DC-to-AC converter and a second conductive shield element lining an outer wall of the high voltage compartment.

Also disclosed is an enclosed power converter that includes an outer housing formed of dielectric material and including a low voltage compartment and a high voltage compartment. The enclosed power converter also includes a first conductive shield element lining an outer wall of the low voltage compartment, the first conductive shield element being electrically coupled to an electrical input and a second conductive shield element ling an outer wall of the high voltage compartment and connected to an output of an electrical component disposed in the high voltage compartment. A first leakage current sensor is disposed between the low voltage compartment and the high voltage compartment and a primary signal processing circuit is provided that integrates a leakage current measured by the first leakage current sensor.

In addition, an enclosed power converter that includes an outer housing formed of dielectric material that includes a low voltage compartment and a high voltage compartment. The power converter also includes a first conductive shield element lining an outer wall of the low voltage compartment, the first conductive shield element being electrically coupled to an electrical input and a second conductive shield element lining an outer wall of the high voltage compartment and connected to an output of an electrical component disposed in the high voltage compartment. In addition, the power converter includes a throughway connecting the high voltage compartment to the low voltage compartment, the throughway causing a break in the surface of the first and second conductive shields and first and second conductive rings, the first conductive surrounding the break in the surface of the first conductive shield and the second conductive ring surrounding the break in the second conductive shield.

Also disclosed is a method of forming an enclosed power converter. The method includes: providing an outer housing formed of dielectric material, the outer housing including a low voltage compartment and a high voltage compartment; providing a low voltage DC-to-AC converter in the low voltage compartment; lining an outer wall of the low voltage compartment with a low voltage conductive shield element; and referencing the low voltage conductive shield element to a voltage provided to the DC-to-AC converter.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

As will be described below, a two compartment enclosure is formed using a high-voltage (HV) dielectric material. The enclosure can be divided such that high voltage components are generally separated from low voltage components. The simplest case: two compartments: HV and LV. Of course, other configurations are possible.

Regardless of the number of compartments, in one embodiment, a conductive shield is placed onto the inner surface of two or more (or each) compartments. In one embodiment, the shield is arranged such that be no air pockets exist between the shield and the insulating barrier (e.g., the material forming the enclosure). In this manner, the shield lines an outer wall of the compartments into which a power converter is inserted.

In one embodiment, the inner surfaces of shields and compartments shall be smooth to reduce HV electric field intensity and eliminate ionization in one embodiment. Further, the shields in each compartment are connected to a "local" DC voltage maintaining minimum voltage difference between the shield and the enclosed components in one embodiment. In particular, primary shields may be connected the primary DC and the secondary shields may be connected to the output DC. While not limiting, herein, the secondary may be considered high voltage while the primary is considered low voltage. The connection may be to the return line in one embodiment. In one or more embodiment, another shield (e.g. a conductive coating) may be applied to an external surface of the enclosure and connected it to a ground potential.

Figure 1:
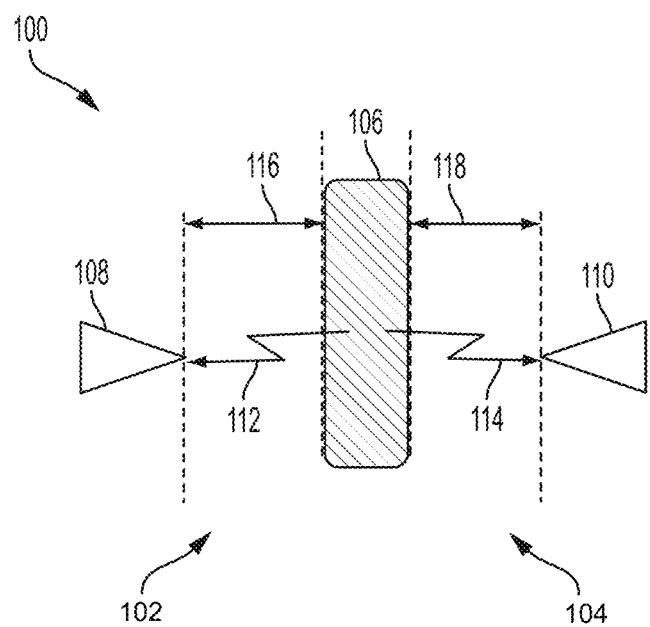
FIG. 1 shows a simplified system with high and low voltage sections and how discharges may occur.
Figure 2:
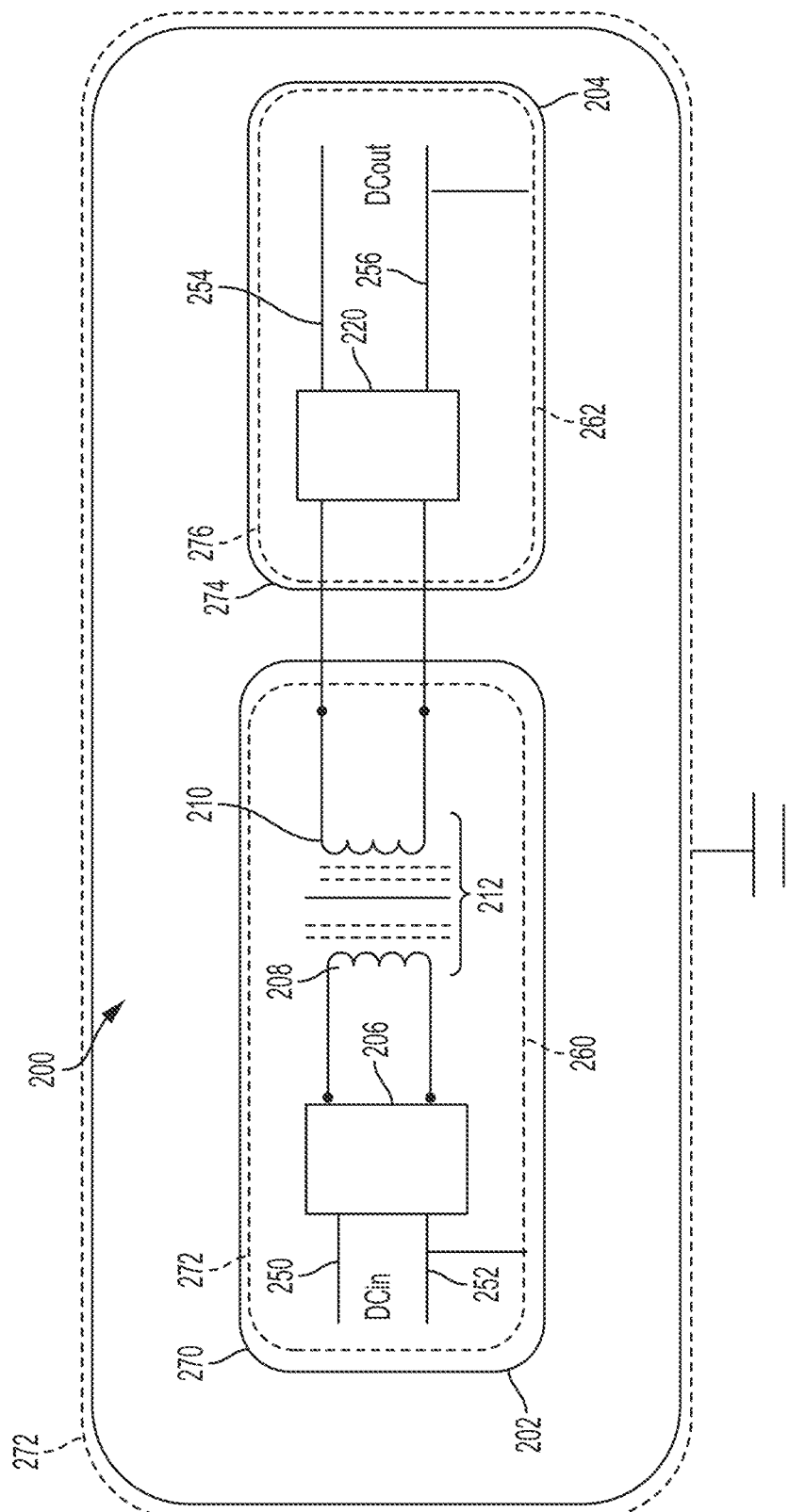
FIG. 2 shows an example circuit disposed in an enclosure according to one embodiment.

FIG. 2 shows a simplified version of a two compartment enclosure 200 that includes, in this example, a primary or low voltage compartment 202 and a secondary or high voltage compartment 204. The enclosure 200 may be formed of a dielectric and, more specifically, a high voltage dielectric.

The low voltage compartment 202 may receive, for example, a low voltage DC input (DCin). This voltage may be a differential voltage in one embodiment provided on positive 250 and return 252 lines.

In operation, DCin is converter to a DC output (DCout) that is at a different voltage level than DCin, the level of which depends, partially, on the turns ratio between the primary 208 and secondary 210 of a transformer 212. In order to convert DCin to be in form (e.g., an AC voltage) that allows for level conversion between the primary and secondary windings 208, 210, a DC-to-AC converter 206 is provided. The DC-to-AC converter 206 may also be referred to as in inverter. The inverter 206 may include, for example, a primary power conversion element, a primary controller, and a primary bias power supply that provides power to the controller. As the type of inverter is not limited herein, a detailed explanation is not provided. However, generally, the power conversion element includes one or more switching elements connected to the primary winding 208. The controller is used to control when the one or more switches are opened/closed. That controller is typically operating at different (e.g., lower) power/voltage than is provided by DCin and, thus, the bias power supply converts DCin to a lower value to power the controller. It shall be understood that while the inverter 206 is shown as being wholly within the primary compartment 202, portions thereof (e.g., the bias power source and the controller) may in a region outside of that compartment.

As illustrated, the compartments 202 and 204 are shown as separately formed in the insulating material (e.g., a dielectric) that forms the enclosure 200. It shall be understood and is further described below that one or more passages may be formed through the enclosure 200 to connected components in one compartment to another. For instance, a passage may be formed through the enclosure 200 to allow the output of secondary winding 210 to be connected to a high voltage AC to DC converter 220 that is located in the high voltage compartment 204.

The high voltage compartment 204 includes high voltage DC output (DCout). This voltage may be a differential voltage in one embodiment provided on positive 254 and return 256 lines.

Also, as illustrated, each of the primary and secondary windings 208, 210 are shown as being contained in the low voltage compartment 202. Both of these windings would be contained in the high voltage compartment 204 in one embodiment.

Each of the compartments 202, 204 includes a conductive shield 260, 262 formed on its inner surface. In one embodiment, the shields are formed of a metal foil. In one embodiment, the shields contact the compartments such that no air pockets between the shield and the compartment's surface. As illustrated, the compartments and shields are formed such that they have rounded corners (e.g., corners 270, 272, 274, 276). The rounded corners are a visual representation of the fact that the inner surfaces of shields and compartments are smooth in one embodiment to reduce HV electric field intensity and eliminate ionization.

Each shield 260, 262 is electrically connected to a "local" DC voltage (e.g., one of positive or return lines). This maintains a minimum voltage difference between the shield and the enclosed components. In more detail, the primary shield 260 is connected to one or the positive or return lines 250, 252 of DCin and the secondary shield 262 is connected to one or the positive or return lines 254, 256 of DCout.

In one embodiment, a conductive coating 272 or other shielding material is disposed on an outer surface of the enclosure 200 and connected to either a cabinet, local or earth ground.

Figure 3:
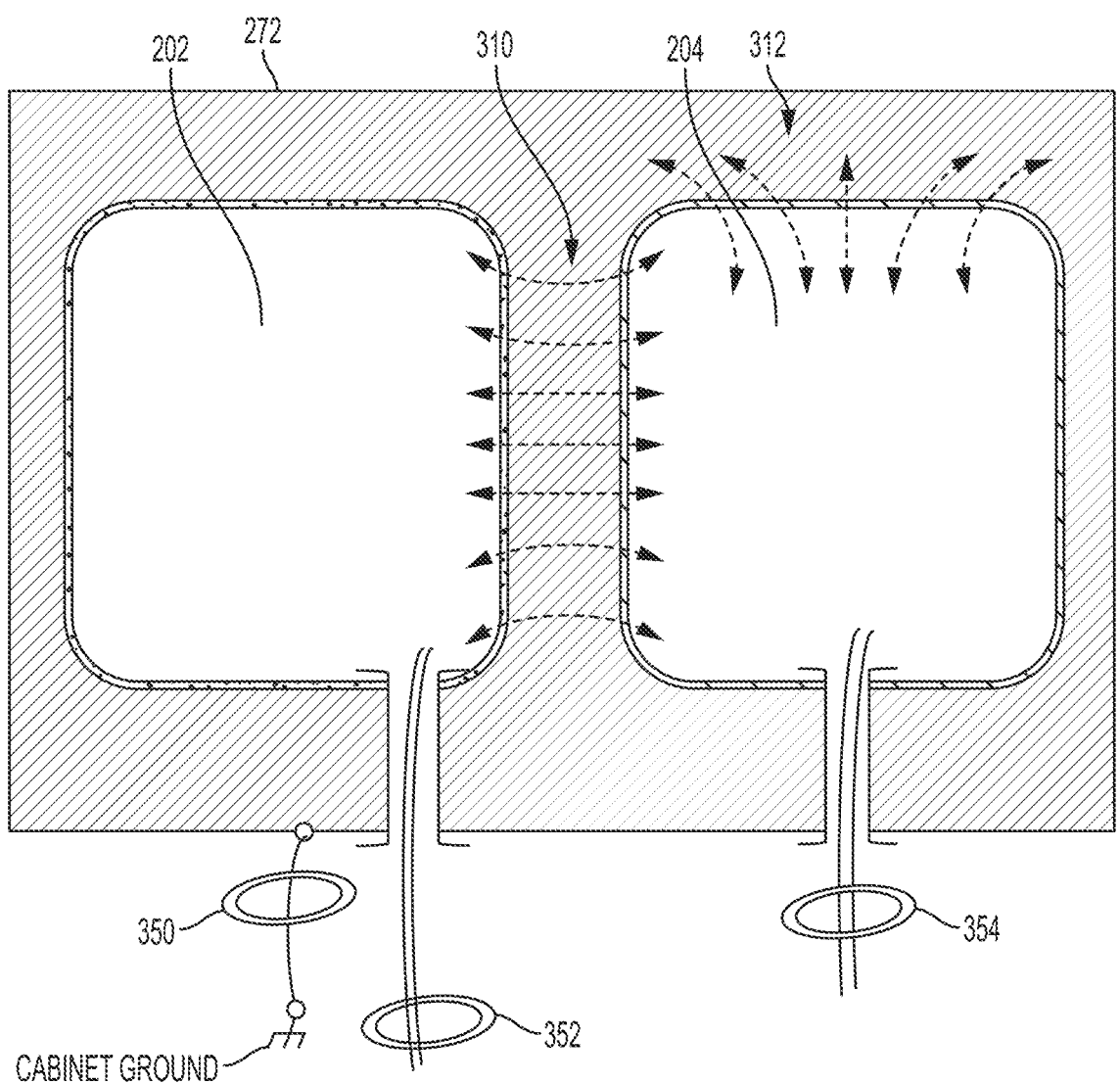
FIG. 3 shows one manner to measure leakage currents.

With reference now to FIG. 3, in operation, it may beneficial to predict and detect location of impending insulation breakdown between the compartments. In operation it has been discovered that there are two major sources of leakage currents: Primary to secondary (LV to HV; from compartment 202 to compartment 204 shown as arrows 310) and from Secondary to ground (HV to ground; form compartment 204 to ground shown as arrows 310). These leakages cannot be directly measured using common mode sensor such as a total ground current sensor 350, a total primary ground current sensor 352 and a total secondary ground sensor 354. Without a direct measurement, it is not known if or where a breakdown may be occurring.

In one embodiment this may be rectified by adding sensors in locations that can directly measure the primary to secondary leakage currents and ground leakage currents.

Figure 4:
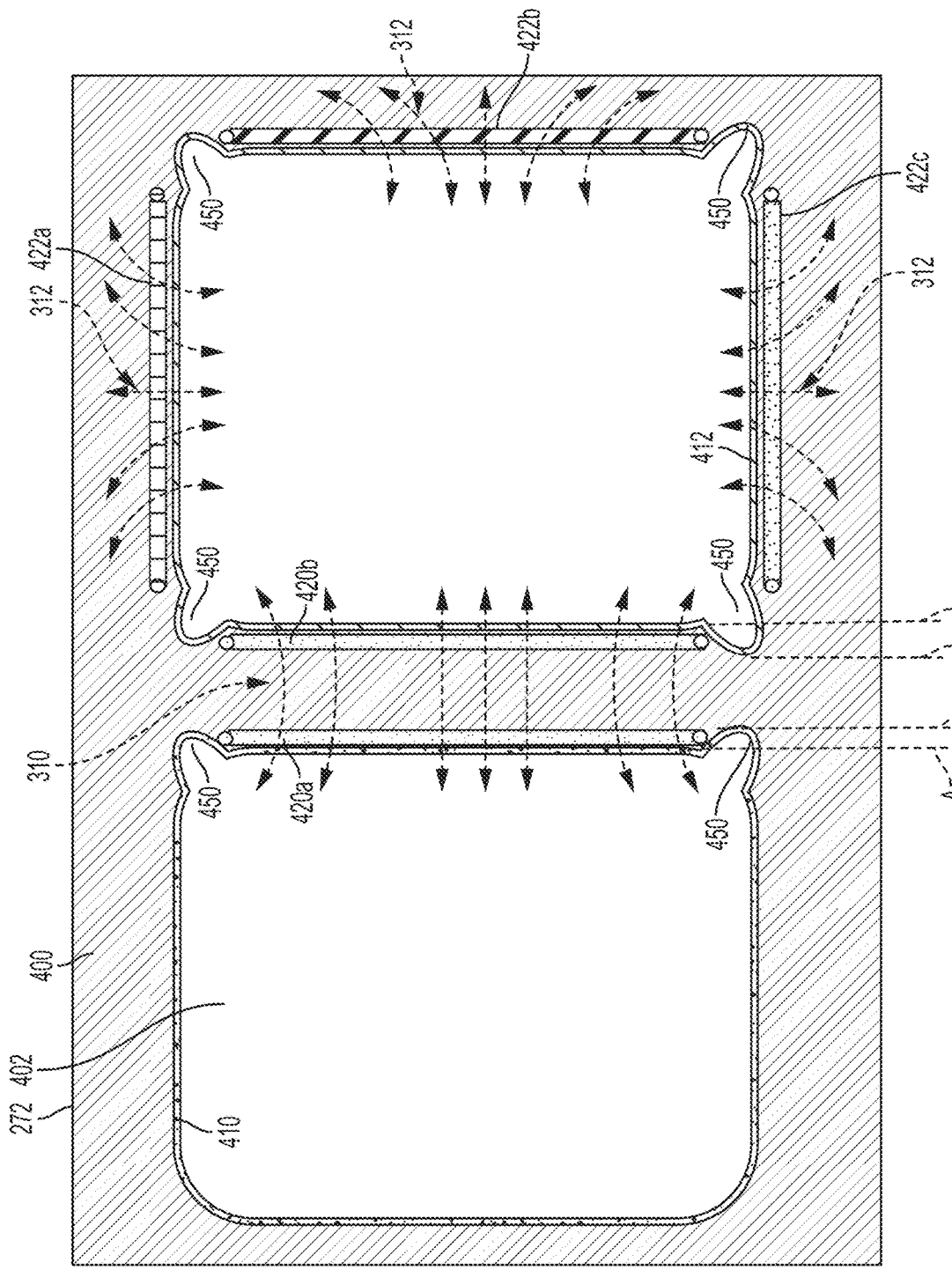
FIG. 4 shows an example enclosure with embedded leakage sensors and corona guards formed in the compartments.

With reference now to FIG. 4, a two compartment enclosure 400 according to one embodiment is illustrated. In this example, a primary or low voltage compartment 402 and a secondary or high voltage compartment 204 are provided. As above, each has conductive shield 410, 412 disposed on an inner surface thereof. Also illustrated are the primary to secondary leakage currents 310 and secondary to ground leakage currents 312. To measure these currents, one or more leakage current sensors are provided. The sensors are, in one embodiment, Rogowski coils. Such coils measuring alternating current (AC) and consist of a helical coil of wire with the lead from one end returning through the center of the coil to the other end, so that both terminals are at the same end of the coil without a metal (iron) core. Because the voltage that is induced in the coil is proportional to the rate of change (derivative) of current in the straight conductor, the output of the Rogowski coil is usually connected to an electrical (or electronic) integrator circuit to provide an output signal that is proportional to the current.

As shown, each compartment includes a primary to secondary leakage sensor 420a, 420b. Also, surrounding each of the remaining 3 three sides of the secondary compartment 404 are ground leakage sensors 422a, 422b and 422c. Of course, all three are not required in all embodiments.

The compartments 402, 404 in this embodiment include corona guards 450 formed at location where the sensors are located. The guards 450 protrude beyond individual sensors and may have a cylindrical or any other shape suitable for the specific package that reduces the electric field gradient. The corona guards 450 may extend beyond a plane of one of the outer walls of the compartment as is indicated by the difference in planes A and B (or A' and B') in FIG. 4. The corona guards may be formed such that all edges are rounded.

The number of corona guards 450 in each of the compartments 402, 404 depends on the number of sensors 420, 422 arranged around them. As illustrated, the low voltage compartment 402 includes 2 corona guards, one at each corner adjacent sensor 420a and the high voltage compartment 404 includes 4 corona guards, one at each corner. As shown, each compartment is generally a rectangular in shape and in one embodiment, one or more of the compartments is square.

Figure 5:
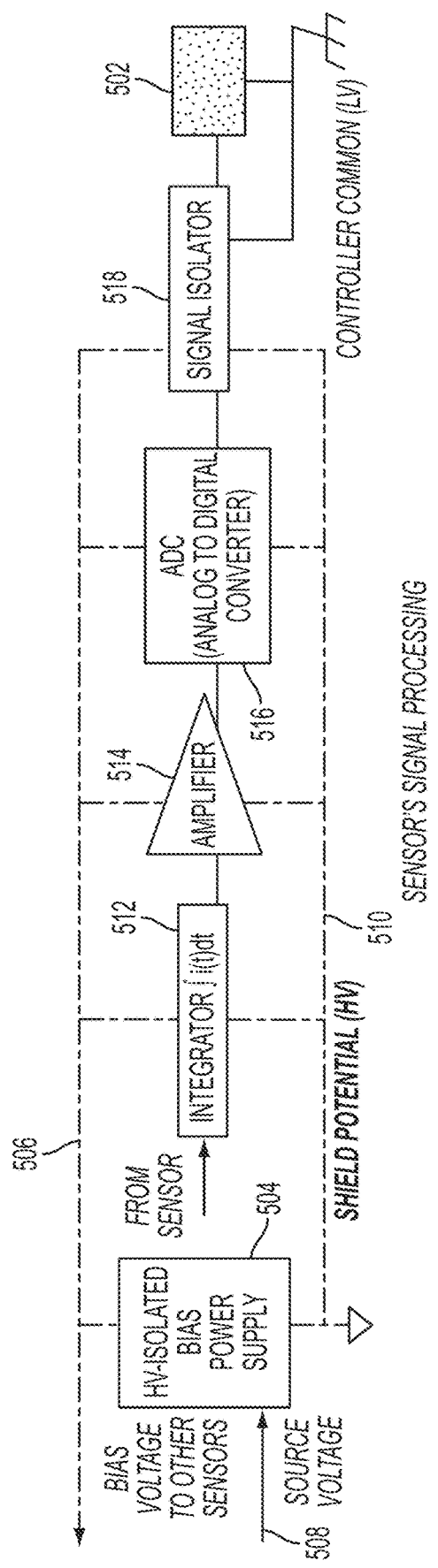
FIG. 5 shows an example leakage sensor processing circuit that may be used with any sensor disclosed herein.

FIG. 5 shows an example circuit 400 that may be connected to each of the sensors 420, 422. The circuit, in general, receives a sensor input and determines if the sensor input exceeds an expected value, an alarm or shut down can be initiated by a controller 502.

The circuit 500 includes a bias power supply 504 that is connected to primary or secondary voltage level (e.g., DCin or DC out). It shall be understood that the circuit 500 could be duplicated, once for the primary compartment and once for the secondary enclosure. The voltage level that the bias power supply will receive will, therefore, be based on DCin if connected to the primary enclosure and DCout if connected the secondary enclosure. As such, the input to the power supply 504 is simply shown by input 508 which is a "source voltage" selected as described above (e.g., either DCin or DCout). The power supply 504 outputs an operational voltage on an output rail or other output 506 is connected to the other components of the circuit. Some or all of the other components (and the power supply) are referenced to the shield potential by a shield connection 510 that is electrically coupled to shield of the compartment to which it attached.

The circuit 500 includes an integrator 512 that integrates a sensor input and is referenced to the local DC potential via connection 510. Optionally, an amplifier 512, an ADC converter 514 and signal isolator 516 may be provided to condition the integrator output before it is presented to the controller 502.

In one embodiment, expected leakage currents under normal operating conditions are calculated and stored in the controller. Then, in operation, leakage currents for all surfaces of interest under actual conditions are measured (a separate circuit 500 may be provided for each surface). The measured data may then be compared to the expected leakage currents stored in the controller's 502 memory. If the measured leakage currents exceed the stored or other threshold leakage values, the controller 502 may send a warning or shutdown the electronics.

Figure 6:
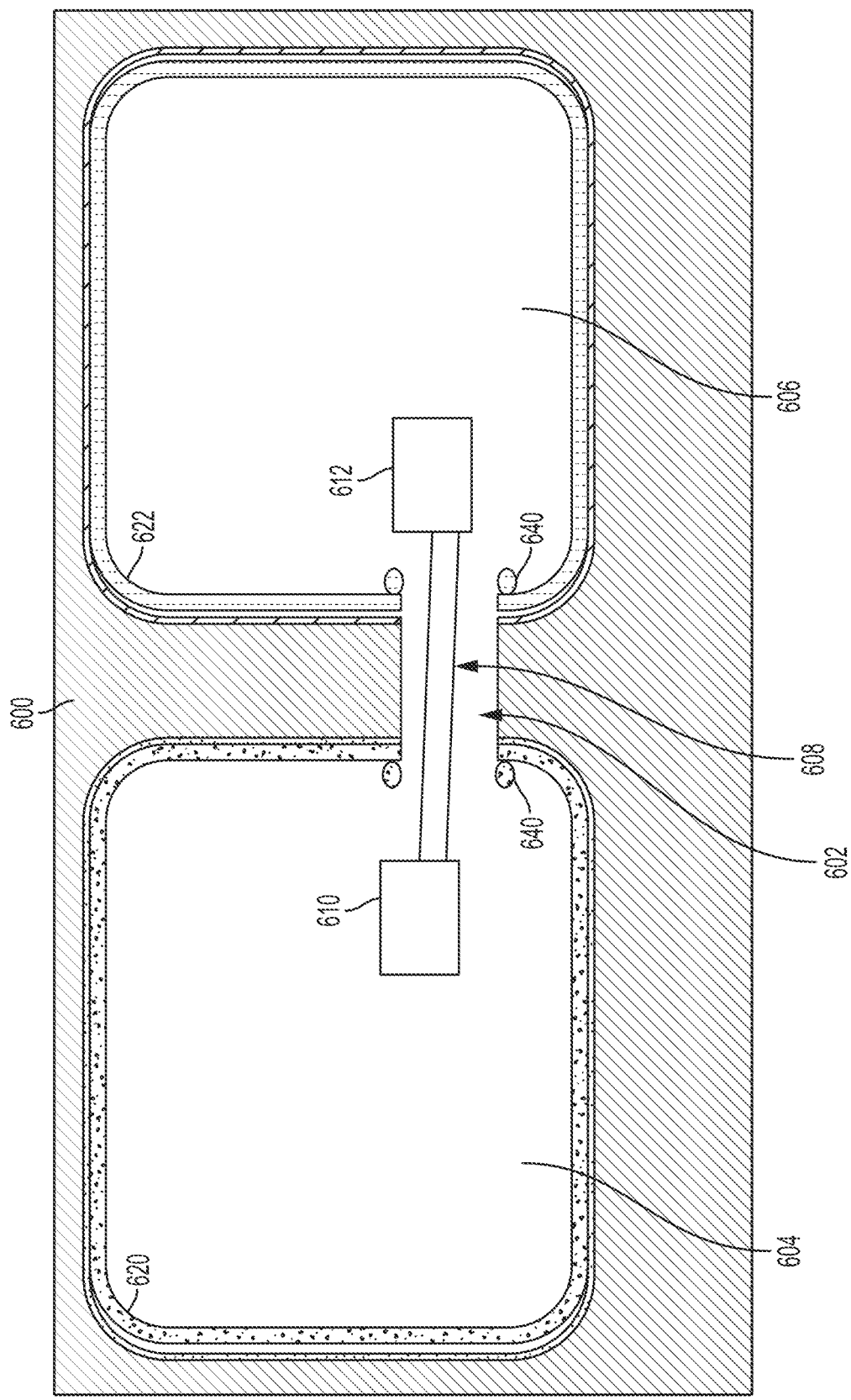
FIG. 6 illustrates guard rings added where shielding is broken.

In the above example, no throughway have been shown to connect the low and high voltage compartments. As one will understand, such may be required in some instances. Formation of such a throughway may lead to sharp corners in the compartments and the shields. Such sharp corners may lead increased electrical field intensity in such locations. To that end, with reference to FIG. 6, a throughway 602 is shown connecting a low voltage compartment 604 to a high voltage compartment 606 formed in an enclosure 600 made of dielectric as described above. The enclosures 604 and 606 may have shields 620, 622 formed as described above. Wires 608 that pass through throughway 602 are illustratively shown connecting a first circuit 610 in the low voltage compartment 604 to second circuit in the high voltage compartment 606.

As illustrated, it is clear that the shields 620, 622 break at the boundary with the throughway 602. To reduce the electric field intensity, a conductive guard ring 640 is added at the intersection of the throughway 602 and the shields 620, 622.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts and equivalents of all means or step plus function elements in the claims below are intended to include any structure, material or act for performing the function in combination with other claimed elements as claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While embodiments have been described, it will be understood that those skilled in the art, both now and in the future, may make various improvements and enhancements which fall within the scope of the claims which follow. These claims should be construed to maintain the proper protection for the invention first described.

What is claimed is:

1. An enclosed power converter comprising:
   an outer housing formed of dielectric material, the outer housing including a low voltage compartment and a high voltage compartment;
   a first conductive shield element lining an outer wall of the low voltage compartment, the first conductive shield element being electrically coupled to an electrical input;
   a second conductive shield element lining an outer wall of the high voltage compartment and connected to an output of an electrical component disposed in the high voltage compartment;
   a first leakage current sensor disposed between the low voltage compartment and the high voltage compartment; and
   a primary signal processing circuit that integrates a leakage current measured by the first leakage current sensor.

2. The enclosed power converter of claim 1, further comprising:
   a throughway connecting the high voltage compartment to the low voltage compartment, the throughway causing a break in the surface of the first and second conductive shield elements.

3. The enclosed power converter of claim 1, wherein the primary signal processing circuit is connected to the first conductive shield.

4. The enclosed power converter of claim 1, further comprising:
   a second leakage current sensor disposed between the high voltage compartment and an outer wall of the outer housing.

5. The enclosed power converter of claim 4, further comprising:
   a secondary signal processing circuit that integrates a leakage current measured by the second leakage current sensor.

6. The enclosed power converter of claim 5, wherein the secondary signal processing circuit is connected to the second conductive shield.

7. The enclosed power converter of claim 4, wherein the high voltage compartment includes at least one corona guard that extends beyond an outer wall of the high voltage compartment and has all rounded edges.

8. The enclosed power converter of claim 7, wherein the high voltage compartment includes first and second corona guards that extends beyond an outer wall of the high voltage compartment at or near opposing ends of the second leakage current sensor.

9. The enclosed power converter of claim 1, further comprising:
   a second leakage current sensor disposed between the high voltage compartment and an outer wall of the outer housing;
   a secondary signal processing circuit that integrates a leakage current measured by the second leakage current sensor and that is connected to the second conductive shield; and
   a controller connected to the primary and secondary signal processing circuits that controls controllers operation of electronics in the low voltage compartment based on outputs of at least one of the primary and secondary signal processing circuits.

10. A method of forming an enclosed power converter comprising:
    providing an outer housing formed of dielectric material, the outer housing including a low voltage compartment and a high voltage compartment;
    providing a low voltage DC-to-AC converter in the low voltage compartment;
    lining an outer wall of the low voltage compartment with a low voltage conductive shield element;
    referencing the low voltage conductive shield element to a voltage provided to the DC-to-AC converter;
    lining an outer wall of the high voltage compartment with a high voltage conductive shield element;
    referencing the high voltage conductive shield element to a voltage created in the high voltage compartment; and
    forming a throughway between the outer wall of the low voltage compartment and the outer wall of the high voltage compartment such that the throughway causes a break in the surface of the first and second conductive shield elements.

11. A method of forming an enclosed power converter comprising:
    providing an outer housing formed of dielectric material, the outer housing including a low voltage compartment and a high voltage compartment;
    providing a low voltage DC-to-AC converter in the low voltage compartment;
    lining an outer wall of the low voltage compartment with a low voltage conductive shield element;
    referencing the low voltage conductive shield element to a voltage provided to the DC-to-AC converter; and
    measuring a leakage current between the low voltage conductive shield element and a reference voltage with a leakage current sensor.

12. The method as claimed in claim 11, further comprising:
    measuring a ground leakage current between the high voltage conductive shield element and a reference voltage with a first leakage current sensor.

13. The method as claimed in claim 12, further comprising:
    measuring a leakage current between the high voltage compartment and the low voltage compartment with a second leakage current sensor.

14. The method as claimed in claim 13, further comprising:
    disposing the first and second leakage current sensors in the outer housing.

* * * * *